United States Patent
Iwaida et al.

(10) Patent No.: US 6,824,858 B2
(45) Date of Patent: Nov. 30, 2004

(54) PHOTOCURABLE/THERMOSETTING COMPOSITION FOR FORMING MATTE FILM

(75) Inventors: Satoru Iwaida, Sakado (JP); Yoshihiro Ohno, Iruma-gun (KP); Masayuki Isono, Hidaka (JP); Akio Sekimoto, Tsurugashima (JP)

(73) Assignee: Taiyo Ink Manufacturing Co., Ltd. (JP)

( * ) Notice: Subject to any disclaimer, the term of this patent is extended or adjusted under 35 U.S.C. 154(b) by 127 days.

(21) Appl. No.: 10/216,802

(22) Filed: Aug. 13, 2002

(65) Prior Publication Data

US 2003/0082355 A1 May 1, 2003

Related U.S. Application Data

(63) Continuation of application No. PCT/JP00/00795, filed on Feb. 14, 2000, now abandoned.

(51) Int. Cl.$^7$ .............................. B32B 7/00; G03C 1/73; C08F 2/46
(52) U.S. Cl. ...................... 428/209; 430/286.1; 522/81; 522/83; 522/103; 522/33; 522/48; 522/53; 522/56; 522/67; 522/60
(58) Field of Search ........................ 428/209; 430/286.1, 430/280.1; 522/103, 81, 83, 33, 48, 53, 56, 60, 67, 41, 100, 102, 110, 111, 129, 109

(56) References Cited

U.S. PATENT DOCUMENTS

| | | | | |
|---|---|---|---|---|
| 5,506,321 A | * | 4/1996 | Koto et al. .................. | 526/273 |
| 5,538,821 A | * | 7/1996 | Kakinuma et al. ............. | 430/18 |
| 5,702,820 A | * | 12/1997 | Yokoshima et al. ......... | 428/413 |
| 5,753,722 A | | 5/1998 | Itokawa et al. ................ | 522/82 |
| 5,849,460 A | * | 12/1998 | Kawai et al. ............. | 430/280.1 |
| 5,849,857 A | * | 12/1998 | Awaji et al. ................... | 528/98 |
| 5,858,618 A | * | 1/1999 | Tzou ........................ | 430/285.1 |
| 6,399,277 B1 | * | 6/2002 | Nojima et al. ............ | 430/280.1 |
| 6,465,540 B1 | * | 10/2002 | Kubo et al. ................. | 522/100 |
| 6,555,592 B2 | * | 4/2003 | Tseng et al. ................... | 522/39 |

FOREIGN PATENT DOCUMENTS

| | | |
|---|---|---|
| JP | 5 204150 A | 8/1993 |
| JP | 7 072624 A | 3/1995 |
| JP | 9-185167 | 7/1997 |
| JP | 11 311858 A | 11/1999 |
| WO | WO 97/16470 | 5/1997 |
| WO | WO 98/00759 * | 1/1998 |

OTHER PUBLICATIONS

Supplementary EPO Search Report dated Mar. 10, 2004.

* cited by examiner

*Primary Examiner*—Susan Berman
(74) *Attorney, Agent, or Firm*—Rader, Fishman & Grauer PLLC

(57) ABSTRACT

A photocurable and thermosetting composition which is useful in forming a matte film and can be developed with an aqueous alkaline solution is provided. The composition comprises (A) a photosensitive prepolymer obtained by causing a saturated or unsaturated polybasic acid anhydride to react with a hydroxyl group of an esterification product of a novolak type epoxy compound and an unsaturated monocarboxylic acid, (B) a carboxyl group-containing copolymer resin, (C) a photopolymerization initiator, (D) a diluent, (E) a polyfunctional epoxy compound having at least two epoxy groups in its molecule, and, when necessary, (F) an inorganic filler. The composition may further comprise (G) an epoxy resin curing agent. This composition can be advantageously used for the formation of a solder resist on a printed circuit board.

23 Claims, No Drawings

PHOTOCURABLE/THERMOSETTING COMPOSITION FOR FORMING MATTE FILM

CROSS-REFERENCE TO RELATED APPLICATIONS

This is a continuation of Application PCT/JP00/00795, filed Feb. 14, 2000, now abandoned.

BACKGROUND OF THE INVENTION

1. Field of the Invention

This invention relates to a photocurable and thermosetting liquid composition capable of forming a matte film of low gloss and more particularly to a photocurable and thermosetting composition developable with an aqueous alkaline solution and suitable for the formation of such a matte film as a solder resist and an interlaminar insulating layer of household or industrial printed circuit boards.

2. Description of the Prior Art

In recent years, owing to the trend of printed circuit boards toward patterns of growing fineness, the adhesion of solder to the resist film which occurs during the course of wave soldering forms a major cause for inducing such defects as bridges. It is commonly done in the art to form a resist film having a matte surface for the purpose of precluding such defects, thereby enhancing the resistance of the resist film to adhesion of solder during the course of wave soldering and precluding the adhesion of solder thereto. The compositions to be used for forming such matte films of this class heretofore well known to the art are such that are formed by the incorporation of various fillers such as silica and talc as a matting component.

In such a matte resist composition, however, its thixotropy increases in proportion as the amount of filler incorporated therein increases, which eventually induces the composition to emit bubbles and raise skips during the course of printing and entails a clear decline in printability thereof. Although the incorporation of the filler in the composition in a large amount gives rise to a matte surface, such a large amount of filler poses disadvantages of exerting a harmful influence on the electrical insulating properties etc. of the film to be formed.

Then, in the case of the matte resist composition using a filler of large particle diameters as a matting component, when the film is formed in a small thickness pattern, the fillers are liable to come into view through the surface of a coating film due to their large particle diameters and consequently induce infiltration of such extraneous matter as water and chemicals along the interface between the filler and the resin matrix until the surface of the substrate, which will result in deficiency in reliability of the film as in terms of resistance to chemicals and electrical insulating properties. This composition is also at a disadvantage in failing to satisfy the need for fine patterns on account of the large particle diameters of the filler.

SUMMARY OF THE INVENTION

A main object of the present invention, therefore, is to provide a photocurable and thermosetting composition which is capable of forming a matte film possessed of good properties even if it contains no filler as a matting component or contains a filler only in a small amount.

Another object of the present invention is to provide at a low cost a photocurable and thermosetting composition which excels in ability to form fine patterns, retains low gloss of the film stably, and is useful for the formation of a matte film excelling in such film properties as resistance to adhesion of solder during the course of wave soldering, resistance to chemicals, resistance to electroless gold plating, electrical insulating properties, resistance to heat, fastness of adhesion, and hardness.

To accomplish the objects mentioned above, in accordance with a first fundamental embodiment of the present invention, there is provided a photocurable and thermosetting composition for forming a matte film, which comprises (A) a photosensitive prepolymer obtained by causing a saturated or unsaturated polybasic acid anhydride to react with a hydroxyl group of an esterification product of a novolak type epoxy compound and an unsaturated monocarboxylic acid, (B) a carboxyl group-containing copolymer resin, (C) a photopolymerization initiator, (D) a diluent, and (E) an epoxy compound having at least two epoxy groups in its molecule (hereinafter referred to as a "polyfunctional epoxy compound").

In accordance with a second embodiment of the present invention, there is provided a photocurable and thermosetting composition for forming a matte film, which comprises (A) a photosensitive prepolymer obtained by causing a saturated or unsaturated polybasic acid anhydride to react with a hydroxyl group of an esterification product of a novolak type epoxy compound and an unsaturated monocarboxylic acid, (B) a carboxyl group-containing copolymer resin, (C) a photopolymerization initiator, (D) a diluent, (E) a polyfunctional epoxy compound, and (F) an inorganic filler.

These photocurable and thermosetting compositions may contain further (G) a curing agent for epoxy resin.

As the carboxyl group-containing copolymer resin (B) mentioned above, (b-1) a copolymer of an unsaturated carboxylic acid with another compound having an unsaturated double bond, (b-2) a prepolymer obtained by causing an epoxy group-containing unsaturated compound to partially react with a carboxyl group of a copolymer of an unsaturated carboxylic acid and another compound having an unsaturated double bond, or (b-3) a prepolymer obtained by causing addition reaction of a carboxyl group-containing compound to an epoxy group of an epoxy group-containing copolymer and then causing a saturated or unsaturated polybasic acid anhydride to react with the hydroxyl group caused by the above reaction is preferred to be used. It is desirable that the ratio of the aforementioned photosensitive prepolymer (A) to the carboxyl group-containing copolymer resin (B) to be incorporated should be (A):(B)=100: about 5 to about 250, preferably (A):(B)=100:5 to <100, in weight ratio.

Since the photocurable and thermosetting composition mentioned above is capable of forming a matte film which excels in such film properties as resistance to adhesion of solder during the course of wave soldering, resistance to chemicals, resistance to electroless gold plating, electrical insulating properties, resistance to heat, and hardness and is possessed of excellent fastness of adhesion to a copper foil and to various deposited layers by plating owing to microfine rises and falls in the film surface, it is useful in preparing such matte films as a solder resist and an interlaminar insulating layer in printed circuit boards. In a particularly advantageous embodiment, there is provided a printed circuit board having a resist film formed thereon from a cured and patterned resist film of the photocurable and thermosetting composition mentioned above and possessed of a 60° gloss value of not more than about 50, preferably mot more than about 30, in the film surface in accordance with ASTM D 523-89.

DETAILED DESCRIPTION OF THE INVENTION

The present inventors, after pursuing a diligent study with a view to attaining the objects mentioned above, have found that surprisingly for them the photocurable and thermosetting composition which comprises (A) a photosensitive prepolymer obtained by causing a saturated or unsaturated polybasic acid anhydride to react with a hydroxyl group of an esterification product of a novolak type epoxy compound and an unsaturated monocarboxylic acid and (B) a carboxyl group-containing copolymer resin in combination is capable of forming a good matte film even when a matting component is not added to the composition. The present inventors have further found that, when an inorganic filler as a matting component is added to such a photocurable and thermosetting composition even in a small amount, it is possible to obtain a matte film exhibiting a further lower gloss value and having microfine rises and falls in the coating film surface. Since such a photocurable and thermosetting composition exhibits a matting effect by the resin components themselves, it is possible to suppress the addition of the matting component to the utmost. As a result, the change in thixotropy of the composition becomes small and the composition is capable of forming a matte film which manifests low gloss stably even after a protracted storage and excels in resistance to adhesion of solder to the resist film during the course of wave soldering, resistance to chemicals, etc. and is possessed of excellent adaptability for fine patterns.

The reason why a good matte film is formed by using the photocurable and thermosetting composition mentioned above is inferred that the coating film formed from this composition has the islands-in-sea structure in which the carboxyl group-containing copolymer resin (B) is dispersed in the photosensitive prepolymer (A) due to poor compatibility of the photosensitive prepolymer (A) with the carboxyl group-containing copolymer resin (B) mentioned above and the incident light irregularly reflects due to the difference in refractive indexes thereof.

Further, when the photocurable and thermosetting composition contains an inorganic filler, a matte film having a more lower gloss value is obtained. The reason for this phenomenon is inferred that presence of the inorganic filler allows the formation of microfine rises and falls in the coating film surface and the irregular reflection of the incident light is enhanced by these microfine rises and falls and the inorganic filler particles themselves.

Moreover, the composition of the present invention excels in film reliability in terms of resistance to chemicals, resistance to electroless gold plating, electrical insulating properties, fastness of adhesion, etc. as compared with the conventional composition containing a matting component in a large amount. This may be logically explained by supposing that the content of an inorganic filler is zero or in a small amount even when contained to obtain a matting effect and this renders difficult the otherwise ready infiltration of such extraneous matter as water and chemicals along the interface between the filler and the vehicle. When the particle diameters of the inorganic filler to be used are set to a more fine level, the composition also excels in the ability to form fine patterns. Further, the gloss of the film can be controlled without a sacrifice of any of the properties mentioned above by adjusting the ratio of the aforementioned photosensitive prepolymer (A) to the carboxyl group-containing copolymer resin (B) to be incorporated, the kind of the inorganic filler, and the amount of the inorganic filler to be added.

Since both the photosensitive prepolymer (A) and the carboxyl group-containing copolymer resin (B) mentioned above have numerous free carboxyl groups added to the side chain of the backbone polymers thereof, the composition containing these photosensitive prepolymer (A) and the carboxyl group-containing copolymer resin (B) is developable with a dilute aqueous alkaline solution. When the applied coating film of the composition is developed after exposure to light and then postcured, the addition reaction of the epoxy groups of a polyfunctional epoxy compound (E) separately added to the composition as a thermosetting component with the free carboxyl groups in the side chain mentioned above takes place and the coating film is converted into a matte film excellent in such properties as heat resistance, solvent resistance, acid resistance, adhesiveness, resistance to electroless gold plating, electrical insulating properties, resistance to electrolytic corrosion, and hardness.

Now, the components of the photocurable and thermosetting composition of the present invention will be described in detail below.

First, a photosensitive prepolymer (A) mentioned above is a product obtained by causing the esterification reaction (complete esterification or partial esterification, preferably complete esterification) of the epoxy group of (a) a novolak type epoxy compound with the carboxyl group of (b) an unsaturated monocarboxylic acid and then causing (c) a saturated or unsaturated polybasic acid anhydride to react with the hydroxyl group caused by the above reaction.

As the novolak type epoxy compound (a), for example, those which are obtained by causing such phenols as phenol, cresol, halogenated phenols, and alkyl phenols to react with formaldehyde in the presence of an acidic catalyst and then causing the resultant novolaks to react with an epihalohydrin such as epichlorohydrin and methyl epichlorohydrin may be cited. As the commercially available products, YDCN-701, YDCN-704, YDPN-638, and YDPN-602 produced by Tohto Kasei Co., Ltd., DEN-431 and DEN-439 produced by The Dow Chemical Company, EPN-1138, EPN-1235, and EPN-1299 produced by Ciba Specialty Chemicals Inc., N-730, N-770, N-865, N-665, N-673, N-695, VH-4150, VH-4240, and VH-4440 produced by Dainippon Ink and Chemicals Inc., EOCN-120, EOCN-104, and BRRN-1020 produced by Nippon Kayaku Co., Ltd., and ECN-265, ECN-293, ECN-285, and ECN-299 produced by Asahi Chemical Industry Co., Ltd. may be cited.

Part of the novolak type epoxy compound mentioned above may be replaced with a glycidyl ether type epoxy compound such as bisphenol A type, bisphenol F type, hydrogenated bisphenol A type, brominated bisphenol A type, amino group-containing type, alicyclic type, and polybutadiene-modified type like EPIKOTE 828, EPIKOTE 1007, and EPIKOTE 807 (EPIKOTE is a registered trademark) produced by Yuka-Shell Epoxy K.K.; EPICLON 840, EPICLON 860, EPICLON 3050, and EPICLON 830 (EPICLON is a registered trademark) produced by Dainippon Ink and Chemicals Inc.; DER-330, DER-337, and DER-361 produced by The Dow Chemical Company; Celloxide 2021 and Celloxide 3000 (Celloxide is a registered trademark) produced by Daicel Chemical Industries, Co., Ltd.; TETRAD-X and TETRAD-C produced by Mitsubishi Gas Kagaku Co., Ltd.; EPB-13 and EPB-27 produced by Nippon Soda Co., Ltd.; YD-116, YD-128, YD-013, YD-020, YD-414, ST-3000, ST-110, YDF-190, YDF-2004, and YDF-2007 produced by Tohto Kasei Co., Ltd.; GY-260, GY-255, and XB-2615 produced by Ciba Specialty Chemicals Inc.; and DER-332, DER-662, and DER-542 produced by The Dow Chemical Company, thereby improving the adhesiveness and the flexibility of the cured film. If the proportion of such epoxy compounds is unduly large, however, the heat resistance of the cured film tends to be impaired. Accordingly, it is preferable that phenol novolak type epoxy resins and cresol novolak type epoxy resins, particularly cresol novolak type epoxy resins be used in the case of a solder resist of a printed circuit board.

Next, as concrete examples of the unsaturated monocarboxylic acids (b) to be used for the synthesis of the aforementioned photosensitive prepolymer (A), acrylic acid, dimer of acrylic acid, methacrylic acid, β-styrylacrylic acid, β-furfuryl acrylic acid, crotonic acid, α-cyanocinnamic acid, cinnamic acid; half esters obtained by the reaction of a saturated or unsaturated dibasic acid anhydride with a (meth)acrylate having one hydroxyl group in its molecule or by the reaction of a saturated or unsaturated dibasic acid with an unsaturated monoglycidyl compound, such as, for example, half esters obtained by causing a saturated or unsaturated dibasic acid anhydride such as succinic anhydride, maleic anhydride, phthalic anhydride, tetrahydrophtalic anhydride, hexahydrophthalic anhydride, methylhexahydrophthalic anhydride, methyltetrahydrophthalic anhydride, itaconic anhydride, and methylendomethylene tetrahydrophthalic anhydride, to react in an equimolar ratio with a (meth)acrylate having one hydroxyl group its molecule such as hydroxyethyl (meth)acrylate, hydroxypropyl (meth)acrylate, hydroxybutyl (meth)acrylate, polyethylene glycol mono(meth)acrylate, glycerin di(meth)acrylate, trimethylol propane di(meth)acrylate, pentaerythritol tri(meth) acrylate, dipentaerythritol penta(meth)acrylate, and (meth) acrylate of phenyl glycidyl ether and half esters obtained by causing a saturated or unsaturated dibasic acid such as succinic acid, maleic acid, adipic acid, phthalic acid, tetrahydrophthalic acid, itaconic acid, and fumaric acid to react in an equimolar ratio with an unsaturated monoglycidyl compound such as glycidyl (meth)acrylate and the compounds represented by the formulae (1) to (4) described hereinafter may be cited. These unsaturated monocarboxylic acids may be used either singly or in the form of a combination of two or more members. Among other monocarboxylic acids cited above, acrylic acid and methacrylic acid (when these compound are collectively referred, the term "(meth)acrylic acid" is used), particularly acrylic acid, prove to be particularly desirable from the viewpoint of the photocuring properties. Incidentally, the term "(meth)acrylate" as used in this specification means acrylate, methacrylate, or a mixture thereof. This holds good for the similar expression.

As the typical examples of the saturated or unsaturated polybasic acid anhydrides (c) to be used for the synthesis of the aforementioned photosensitive prepolymer (A), dibasic acid anhydrides such as maleic anhydride, succinic anhydride, itaconic anhydride, phthalic anhydride, tetrahydrophthalic anhydride, hexahydrophthalic anhydride, methylhexahydrophthalic anhydride, endomethylenetetrahydrophthalic anhydride, methylendomethylenetetrahydrophthalic anhydride, chlorendic anhydride, and methyltetrahydrophthalic anhydride; aromatic polycarboxylic anhydrides such as trimellitic anhydride, pyromellitic anhydride, and benzophenonetetracarboxylic dianhydride; and corresponding polycarboxylic anhydride derivatives thereof such as 5-(2,5-dioxotetrahydrofuryl)-3-methyl-3-cyclohexene-1,2-dicarboxylic anhydride may be used. Among other polybasic acid anhydrides cited above, tetrahydrophthalic anhydride and hexahydrophthalic anhydride prove to be particularly desirable.

The complete esterification products (CE) and partial esterification products (PE) of epoxy groups are obtained by relevant reactions of the epoxy compound and the unsaturated monocarboxylic acid mentioned above in accordance with the conventional method in such a proportion that the ratio of the number of equivalents of the epoxy group/the number of equivalents of the carboxyl group falls in the range of 0.8 to 3.3, preferably 0.9 to 1.1 in the case of the complete esterification products (CE) or 1.1 to 2.5 in the case of the partial esterification products (PE). If this ratio of the number of equivalents is less than 0.8, the products inevitably contain free acid and consequently cause the corresponding compositions to suffer from a decline in resistance to soldering heat. Conversely, if the ratio of the number of equivalents mentioned above exceeds 3.3, the compositions will suffer from an undesirable decline in photosensitivity.

The above products can be obtained, for example, by dissolving the novolak type epoxy compound mentioned above in an organic solvent such as cellosolve acetate, carbitol acetate, and methyl ethyl ketone, adding thereto a thermal polymerization inhibitor such as hydroquinone, catechol, and pyrogallol and a catalyst such as a tertiary amine like benzyldimethylamine and triethylamine and a quaternary ammonium salt like benzyl trimethyl ammonium chloride and benzyl triethyl ammonium bromide, mixing the unsaturated monocarboxylic acid mentioned above therein, and causing reaction while stirring and heating them at a temperature in the range of 70 to 140° C.

The ratio of addition reaction of the polybasic acid anhydride mentioned above to the secondary hydroxyl group caused by the esterification reaction of the complete esterification product (CE) or partial esterification product (PE) of the novolak type epoxy compound mentioned above is preferred to be in such a proportion that the ratio of the number of equivalents of the acid anhydride to the number of equivalents of the secondary hydroxyl group of the above esterification product (CE or PE) is not less than 0.3 and that the acid value of the produced resin falls in the range of 30 to 160 mg KOH/g, preferably 45 to 120 mg KOH/g. When this reaction product is used as the photosensitive prepolymer, the resultant composition can be developed with an alkaline developing solution. If the acid value is less than 30 mg KOH/g, the resultant product will manifest insufficient solubility in an alkaline developing solution. Conversely, the acid value exceeding 160 mg KOH/g will give cause to deteriorate various properties of the cured film such as resistance to alkalis and electrical properties expected of a solder resist. When the esterification product (CE or PE) in this case has an unduly large residual epoxy group content, such residual epoxy groups are liable to gel during the reaction with a saturated or unsaturated polybasic acid anhydride. Accordingly, the residual epoxy group content properly is not more than 20%, preferably not more than 15%.

The product aimed at is obtained, for example, by selecting at least one species from the esterification products (CE or PE) mentioned above and at least one species from the polybasic acid anhydrides mentioned above, mixing the selected species, and causing reaction while stirring and heating them at a temperature in the range of 70 to 120° C. in accordance with the usual manner.

Next, as the carboxyl group-containing copolymer resin (B) mentioned above to be used in the present invention, any of carboxyl group-containing photosensitive resins having an ethylenically unsaturated double bond in itself and carboxyl group-containing resins having no ethylenically unsaturated double bond may be used (either of oligomer and polymer may be adopted). Although the carboxyl group-containing copolymer resin (B) is not limited to a particular one, it is preferable that (b-1) a copolymer of an unsaturated carboxylic acid with another compound having an unsaturated double bond, (b-2) a prepolymer obtained by causing an epoxy group-containing unsaturated compound to partially react with a carboxyl group of a copolymer of an unsaturated carboxylic acid and another compound having an unsaturated double bond, or (b-3) a prepolymer obtained by causing addition reaction of a carboxyl group-containing compound to an epoxy group of an epoxy group-containing copolymer and then causing a saturated or unsaturated polybasic acid anhydride to react with the hydroxyl group caused by the above reaction be used.

First, the carboxyl group-containing resin (b-1) mentioned above is a copolymer of (d) an unsaturated carboxylic acid with (e) another compound having an unsaturated double bond.

As concrete examples of the unsaturated carboxylic acid (d) mentioned above, acrylic acid, methacrylic acid, itaconic acid, crotonic acid, maleic acid, fumaric acid, vinylacetic acid, or anhydrides of these acids; and the reaction product of such an acid hydride as maleic anhydride, itaconic anhydride, or pyromellitic anhydride with such a hydroxyl group-containing unsaturated compound as 2-hydroxyethyl (meth)acrylate or 2-hydroxypropyl (meth)acrylate, and other similar hydroxyalkyl (meth)acrylates may be cited. These unsaturated carboxylic acid (d) may be used either singly or in the form of a combination of two or more members. Among other unsaturated carboxylic acids mentioned above, acrylic acid and/or methacrylic acid prove to be preferable.

As concrete examples of the aforementioned unsaturated double bond-containing compound (e), styrene, chlorostyrene, and α-methylstyrene; (meth) acrylates possessing methyl, ethyl, n-propyl, isopropyl, n-butyl, isobutyl, t-butyl, amyl, 2-ethylhexyl, octyl, capryl, nonyl, dodecyl, hexadecyl, octadecyl, cyclohexyl, isobornyl, methoxyethyl, butoxyethyl, 2-hydroxyethyl, 2-hydroxypropyl, and 3-chloro-2-hydroxypropyl as substituent(s); mono(meth) acrylates of polyethylene glycol and mono(meth)acrylates of polypropylene glycol; vinyl acetate, vinyl butyrate, and vinyl benzoate; and acrylamide, methacrylamide, N-hydroxymethyl acrylamide, N-hydroxymethyl methacrylamide, N-methoxymethyl acrylamide, N-ethoxymethyl acrylamide, N-butoxymethyl acrylamide, acrylonitrile, vinyl ethers, and isobutylene may be cited. These compounds (e) may be used either singly or in the form of a mixture of two or more members. Among other compounds mentioned above, styrene, α-methylstyrene, lower alkyl (meth)acrylates, and isobutylene are advantageously used.

Next, the carboxyl group-containing resin (b-2) mentioned above is a prepolymer obtained by causing an epoxy group-containing unsaturated compound to partially react with a carboxyl group of the copolymer (b-1) of (d) the unsaturated carboxylic acid and (e) the compound having an unsaturated double bond mentioned above and includes, for example, the following resins:

(b-2-1) a carboxyl group-containing photosensitive resin obtained by partially adding an ethylenically unsaturated group as a pendant group to the copolymer of (d) the unsaturated carboxylic acid and (e) the compound having an unsaturated double bond, and (b-2-2) a carboxyl group-containing photosensitive resin obtained by causing (g) a compound having a hydroxyl group and an unsaturated double bond to partially react with a copolymer of (e) the compound having an unsaturated double bond and (f) an acid anhydride having an unsaturated double bond.

The carboxyl group-containing photosensitive resin (b-2-1) mentioned above is a resin obtained by causing part of the carboxyl groups of the copolymer (b-1) mentioned above to react with glycidyl (meth)acrylate or hydroxyalkyl (meth) acrylate, for example, thereby inducing introduction of the unsaturated double bond of this glycidyl (meth)acrylate or hydroxyalkyl (meth)acrylate into the side chain of the copolymer. Since the copolymer keeps part of the carboxyl groups contained in the unsaturated carboxylic acid (d) which is one of the monomer components of the aforementioned copolymer in the unreacted form, the carboxyl group-containing photosensitive resin to be obtained continues to be soluble in an aqueous alkaline solution. The film which is formed of the photocurable and thermosetting composition containing such a resin, therefore, permits stable development with an aqueous alkaline solution after the selective exposure to light.

As the ethylenically unsaturated group-containing pendants, vinyl group, allyl group, acryloyl group, and methacryloyl group may be cited. As a method of adding such a pendant group to the copolymer mentioned above, the method of adding an ethylenically unsaturated compound having a glycidyl group, (meth)acrylic chloride, or hydroxyalkyl (meth)acrylate to the carboxylic group of the copolymer is generally adopted.

As the ethylenically unsaturated compound having glycidyl group or (meth)acrylic chloride used herein, glycidyl (meth)acrylate, allyl glycidyl ether, α-methylglycidyl (meth)acrylate, α-ethylglycidyl (meth)acrylate, chrotonyl glycidyl ether, chrotonic acid glycidyl ether, isochrotonic acid glycidyl ether, (meth)acrylic chloride, allyl chloride, methallyl chloride, and the compounds represented by the following formulas (1) to (4) may be cited. Among other compounds mentioned above, glycidyl (meth)acrylate is desirable.

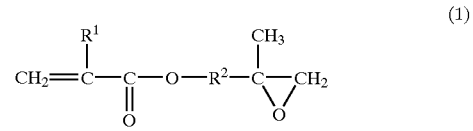

(1)

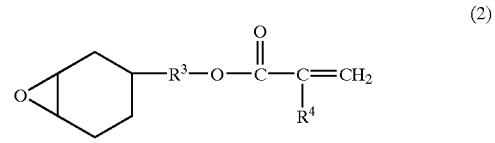

(2)

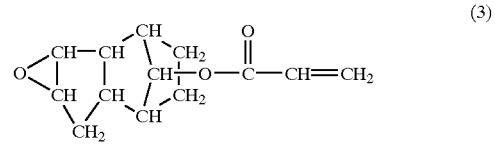

(3)

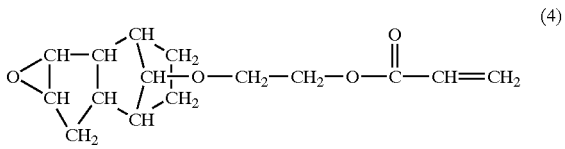

(4)

wherein, $R^1$ and $R^4$ independently represent a hydrogen atom or a methyl group, $R^2$ represents an aliphatic hydrocarbon of 1 to 12 carbon atoms, and $R^3$ represents

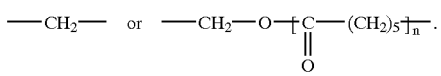

The hydroxyalkyl (meth)acrylates mentioned above are hydroxyalkyl esters of acrylic acid or methacrylic acid. The hydroxyalkyl group of these hydroxyalkyl esters is desired to be an aliphatic hydrocarbon group having 1 to 6 carbon atoms and containing a primary hydroxyl group. As typical examples of such hydroxyalkyl (meth)acrylates containing a primary hydroxyl group, 2-hydoxyethyl acrylate, 2-hydroxyethyl methacrylate, etc. may be cited. It should be noted, however, that these are not exclusive examples.

The carboxyl group-containing photosensitive resin (b-2-2) mentioned above is a resin obtained by causing part of the acid anhydride groups of the copolymer of (e) the unsaturated double bond-containing compound and (f) the unsaturated double bond-containing acid anhydride mentioned above to react with the hydroxyl group of (g) the compound having a hydroxyl group and an unsaturated double bond to produce a half ester, thereby inducing introduction of the unsaturated double bond of the compound (g) mentioned above into the side chain of the copolymer.

As concrete examples of the unsaturated double bond-containing acid anhydride (f) mentioned above, unsaturated polybasic acid anhydrides such as maleic anhydride and itaconic anhydride enumerated as the component (c) mentioned above, and a partial reaction product of pyromellitic anhydride with a hydroxyl group-containing unsaturated compound such as hydroxyalkyl (meth)acrylates like 2-hydroxyethyl (meth)acrylate and 2-hydroxypropyl (meth) acrylate may be cited. These acid anhydrides (f) may be used either singly or in the form of a combination of two or more members. Among other acid anhydrides cited above, maleic anhydride is desirable from the viewpoint of stable synthesis of the polymer.

As concrete examples of the compound (g) having a hydroxyl group and an unsaturated double bond mentioned above, hydroxyalkyl (meth)acrylates such as 2-hydroxyethyl (meth)acrylate and 2-hydroxypropyl (meth) acrylate; a monomer obtained by the reaction of (meth) acrylate with caprolactone, a macromonomer obtained by the reaction of (meth)acrylate with polycaprolactone oligomer, etc. may be cited. These compounds (g) may be used either singly or in the form of a combination of two or more members.

The carboxyl group-containing resin (b-3) mentioned above is a prepolymer obtained by causing addition reaction of a carboxyl group-containing compound to an epoxy group of an epoxy group-containing copolymer and then causing a saturated or unsaturated polybasic acid anhydride to react with the hydroxyl group caused by the above reaction and includes, for example, the following resins:

(b-3-1) a carboxyl group-containing photosensitive resin obtained by causing (d) the unsaturated carboxylic acid mentioned above to react with the aforementioned copolymer of (e) the unsaturated double bond-containing compound and (h) a compound having a glycidyl group and an unsaturated double bond and then causing (c) the saturated or unsaturated polybasic acid anhydride mentioned above to react with the secondary hydroxyl group caused by the above reaction, and (b-3-2) a carboxyl group-containing resin obtained by causing (i) an organic acid having one carboxylic group and no ethylenically unsaturated bond in its molecule to react with a glycidyl group of the aforementioned copolymer of (e) the compound having an unsaturated double bond and (h) the compound having a glycidyl group and an unsaturated double bond and then causing (c) the saturated or unsaturated polybasic acid anhydride mentioned above to react with the secondary hydroxyl group caused by the above reaction.

The carboxyl group-containing photosensitive resin (b-3-1) mentioned above is a resin obtained by causing the carboxyl group of (d) the unsaturated carboxylic acid to react with the epoxy group of the copolymer of (e) the unsaturated double bond-containing compound and (h) the compound having a glycidyl group and an unsaturated double bond in its molecule mentioned above to induce introduction of the unsaturated double bond of the unsaturated carboxylic acid mentioned above into the side chain of the copolymer and then causing the esterification reaction of (c) the polybasic acid anhydride mentioned above to the secondary hydroxyl group caused by the above addition reaction, thereby inducing introduction of the carboxyl group into the side chain of the copolymer. For example, the resins obtained by causing (meth)acrylic acid to react with such a copolymer as a copolymer of alkyl (meth)acrylate and glycidyl (meth)acrylate in a molar ratio of 40:60 to 80:20 and a copolymer of hydroxyalkyl (meth)acrylate, alkyl (meth)acrylate and glycidyl (meth)acrylate in a molar ratio of 10–50:10–70:20–60 and then causing the resultant product to further react with the saturated or unsaturated polybasic acid anhydride (c).

As concrete examples of the compound (h) having a glycidyl group and an unsaturated double bond in its molecule mentioned above, glycidyl (meth)acrylates, α-methyl glycidyl (meth)acrylates and the compounds represented by the chemical formulas (1) to (4) mentioned above may be cited. These compounds (h) may be used either singly or in the form of a combination of two or more members.

The carboxyl group-containing resin (b-3-2) mentioned above is a resin obtained by causing (i) the organic acid having one carboxylic group and no ethylenically unsaturated bond in its molecule to react with the glycidyl group of the aforementioned copolymer having a main chain comprising (h) the compound having a glycidyl group and an unsaturated double bond and (e) the compound having an unsaturated double bond, but no hydroxyl group or acid group, such as alkyl (meth)acrylate and substituted or unsubstituted styrene, and then causing the addition reaction of (c) the saturated or unsaturated polybasic acid anhydride mentioned above to the secondary hydroxyl group caused by the above reaction.

As the organic acid (i) having one carboxylic group and no ethylenically unsaturated double bond in its molecule, alkylcarboxylic acids having 2 to 17 carbon atoms such as acetic acid, propionic acid, n-butyric acid, isobutyric acid, n-dimethylbutyric acid, ethylbutyric acid, hexanoic acid, 2-methylpentanoic acid, 2-ethylpentanoic acid, heptanoic acid, 2-methylheptanoic acid, lauric acid, stearic acid, and n-heptadecanoic acid; and aromatic group-containing alkylcarboxylic acids such as substituted or unsubstituted benzoic acid, (R), (S)-2-phenylpropionic acid, (R)-phenylisopropionic acid, 2-phenylbutyric acid, and 4-phenylbutyric acid may be cited. These organic acids (i) may be used either singly or in the form of a combination of two or more members.

The carboxyl group-containing photosensitive resins and the carboxyl group-containing resins mentioned above may be used either singly or as a mixture. In either case, the proportion of the resin to be incorporated in the composition is preferred to be in the range of about 5 to 250 parts by weight, preferably not less than 5 parts by weight and less than 100 parts by weight, based on 100 parts by weight of the photosensitive prepolymer (A) mentioned above. If the amount of these resins to be incorporated is unduly smaller than the lower limit of the range mentioned above, the film having a satisfactorily low gloss value is formed only with difficulty. Conversely, if the amount is unduly larger than the upper limit of the range mentioned above, no sufficient photo-curing properties will be easily obtained depending on the selection of the carboxyl group-containing resin and the patterning by selective exposure to light and development will be attained only with difficulty.

The carboxyl group-containing photosensitive resins and the carboxyl group-containing resins mentioned above can be used advantageously when their weight-average molecular weights each fall in the range of about 1,000 to 100,000, preferably about 5,000 to 50,000, the acid values each fall in the range of about 20 to 160 mg KOH/g, preferably about 40 to 120 mg KOH/g, and in the case of the carboxyl group-containing photosensitive resins, their double bond equivalent weights fall in the range of about 350 to 2,000, preferably about 400 to 1,500, though the preferred ranges vary depending on the kinds thereof.

If the molecular weight of the resin mentioned above is less than 1,000, a tack-free touch of finger of a coating film will be impaired and the resin will bring an adverse effect on the fastness of adhesion of the coating film during the course of development. Conversely, the molecular weight exceeding 100,000 is not desirable because the resin will tend to impair the operation of development. If the acid value is smaller than 20 mg KOH/g, the solubility of the resin in an aqueous alkaline solution will be insufficient and the development will tend to prove defective. Conversely, the acid value larger than 160 mg KOH/g is not desirable because the fastness of adhesion of the matte film will be degraded and the photo-cured part (exposed part) will tend to produce dissolution during the course of development.

Further in the case of the carboxyl group-containing photosensitive resin, if the double bond equivalent weight of the photosensitive resin is less than 350, no sufficient photo-curing properties and photo-curing depth will be easily obtained. If it is larger than 2,000, the excess will bring a narrower allowance in the operation of development and an undue addition to the exposure dose required for the photo-curing.

As the photopolymerization initiator (C), acetophenones such as acetophenone, 2,2-dimethoxy-2-phenyl acetophenone, 2,2-diethoxy-2-phenyl acetophenone, p-dimethylaminopropiophenone, dichloroacetophenone, trichloroacetophenone, p-tert-butyl trichloroacetophenone, 1-hydroxycyclohexyl phenyl ketone, 2-methyl-1-[4-(methylthio)phenyl]-2-morpholino-propan-1-one, 2-benzyl-2-dimethylamino-1-(4-morpholinophenyl)-butanone-1, and N,N-dimethyl-aminoacetophenone; benzophenones such as benzophenone, methylbenzophenone, 2-chlorobenzophenone, 4,4'-dichlorobenzophenone, 4,4',-bis(dimethylamino)benzophenone, 4,4'-bis(diethylamino) benzophenone, Michler's ketone, and 4-benzoyl-4'-methyl-diphenyl sulfide; benzil; benzoin and ethers thereof such as benzoin methyl ether, benzoin ethyl ether, benzoin isopropyl ether, and benzoin isobutyl ether; ketals such as acetophenone dimethyl ketal and benzyl dimethyl ketal; thioxanthones such as thioxanthone, 2-chlorothioxanthone, 2,4-dimethylthioxanthone, 2,4-diethylthioxanthone, and 2,4-diisopropylthioxanthone; anthraquinones such as 2-methylanthraquinone, 2-ethylanthraquinone, 2-tert-butyl-anthraquinone, 1-chloroanthraquinone, 2-amylanthraquinone, and 2,3-diphenylanthraquinone; organic peroxides such as benzoyl peroxide and cumene peroxide; thiol compounds such as dimer of 2,4,5-triaryl imidazole, riboflavin tetrabutylate, 2-mercaptobenzimidazole, 2-mercaptobenzoxazole, and 2-mercaptobenzothiazole; organic halogen compounds such as 2,4,6-tris-S-triazine, 2,2,2-tribromoethanol, and tribromomethyl phenyl sulfone; 2,4,6-trimethylbenzoyl diphenyl phosphine oxide, for example, may be cited. These compounds may be used either singly or in the form of a combination of two or more members.

The photopolymerization initiator (C) mentioned above may be used in combination with one member or a mixture of two or more members selected from the photosensitizers such as tertiary amines like N,N-(dimethylamino) ethylbenzoate, N,N-(dimethylamino)isoamyl benzoate, penthyl-4-dimethylaminobenzoate, triethyl amine, and triethanol amine.

The preferred combinations of the photopolymerization initiators (C) include the combinations of 2-methyl-1-[4-(methylthio)-phenyl]-2-morphorino-propan-1-one (such as, for example, Irgacure 907 produced by Ciba Specialty Chemicals Inc.: "Irgacure" is a registered trademark) with 2-chlorothioxanthone (such as, for example, Kayacure-CTX produced by Nippon Kayaku Co., Ltd.: Kayacure is a registered trademark), 2,4-diethylthioxanthone (such as, for example, Kayacure-DETX produced by Nippon Kayaku Co., Ltd.), 2-isopropylthioxanthone, or 4-benzoyl-4'-methyldiphenyl sulfide, for example.

The amount of the aforementioned photopolymerization initiator (C) to be used suitably falls in the range of about 0.2 to 30 parts by weight, preferably 2 to 10 parts by weight, based on 100 parts by weight of the aforementioned photosensitive prepolymer (A) (in case the component (B) mentioned above is a carboxyl group-containing photosensitive resin, the total amount of the photosensitive prepolymer and the carboxyl group-containing photosensitive resin). If the amount of the photopolymerization initiator to be used is unduly smaller than the lower limit of the range mentioned above, the composition obtained will suffer from inferior photo-curing properties. Conversely, if the amount is unduly larger than the upper limit of the range mentioned above, the composition will entail the disadvantage of exhibiting inferior quality for cured coating film and poor stability during storage.

As the component (D) mentioned above, namely the diluent, an organic solvent and/or a photopolymerizable monomer may be used.

As the organic solvents, ketones such as methyl ethyl ketone and cyclohexanone; aromatic hydrocarbons such as toluene, xylene, and tetramethyl benzene; glycol ethers such as cellosolve, methyl cellosolve, butyl cellosolve, carbitol, methyl carbitol, butyl carbitol, propylene glycol monomethyl ether, dipropylene glycol monomethyl ether, dipropylene glycol diethyl ether, and triethylene glycol monoethyl ether; acetates such as ethyl acetate, butyl acetate, cellosolve acetate, butyl cellosolve acetate, carbitol acetate, butyl carbitol acetate, propylene glycol monomethylether acetate, and dipropylene glycol monomethyl ether acetate; alcohols such as ethanol, propanol, ethylene glycol, and propylene glycol; aliphatic hydrocarbons such as,octane and decane; and petroleum solvents such as petroleum ether, petroleum naphtha, hydrogenated petroleum naphtha, and solvent naphtha may be cited. These organic solvents may be used either singly or in the form of a combination of two or more members.

The organic solvent is used for the purpose of dissolving the photosensitive prepolymer (A) and the carboxyl group-containing copolymer resin (B) mentioned above, diluting the composition, allowing the composition to be applied in the from of a liquid, enabling the applied layer of the composition to form a film by the predrying, and allowing the film to be exposed to light by the contact exposure.

Though the amount of the organic solvent to be used is not particularly restricted, it is properly in the approximate range of about 30 to 300 parts by weight, based on 100 parts by weight of the total amount of the photosensitive prepolymer (A) and the carboxyl group-containing copolymer resin (B) mentioned above. The amount of the organic solvent may be suitably set so as to fit the method of application to be selected.

On the other hand, as the typical examples of the photopolymerizable monomers, 2-hydroxyethyl (meth)acrylate, 2-hydroxypropyl (meth)acrylate, N-vinylpyrrolidone, acryloyl morpholine, methoxytetraethylene glycol (meth)acrylate, methoxypolyethylene glycol (meth)acrylate, polyethylene glycol di(meth)acrylate, N,N-dimethyl (meth)acrylamide, N-methylol (meth)acrylamide, N,N-dimethylaminopropyl (meth)acrylamide, N,N-dimethylaminoethyl (meth)acrylate, N,N-dimethylaminopropyl (meth)acrylate, melamine (meth)acrylate, diethylene glycol di(meth)acrylate, triethylene glycol di(meth)acrylate, propylene glycol di(meth)acrylate, dipropylene glycol di(meth)acrylate, tripropylene glycol di(meth)acrylate, polypropylene glycol di(meth)acrylate, phenoxyethyl (meth)acrylate, tetrahydrofurfuryl (meth)acrylate, cyclohexyl (meth)acrylate, glycerin diglycidyl ether di(meth)acrylate, glycerin triglycidyl ether tri(meth)acrylate, isobornyl (meth)acrylate, cyclopentadiene mono- or di-(meth)acrylate; polyfunctional (meth)acrylates of polyhydric alcohols such as hexane diol, trimethylol propane, pentaerythritol, ditrimethylol propane, dipentaerythritol, and tris-hydroxyethyl isocyanurate and polyfunctional (meth)acrylates of ethylene oxide or propylene oxide adducts of these polyhydric alcohols; and mono-, di-, tri-, and higher polyesters of polybasic acids with hydroxyalkyl (meth)acrylates may be cited. These photopolymerizable monomers may be used either singly or in the form of a combination of two or more members.

The aforementioned photopolymerizable monomer is used for the purpose of diluting the aforementioned photosensitive prepolymer (A) and the carboxyl group-containing copolymer resin (B) thereby rendering the produced composition easily applicable, and imparting photopolymerizability upon the composition.

The amount of the photopolymerizable monomer to be used is desired to fall in the range of about 3 to 50 parts by weight, based on 100 parts by weight of the total amount of the photosenitive prepolymer (A) and the carboxyl group-containing copolymer resin (B) mentioned above. If the amount of the photopolymerizable monomer is unduly smaller than the lower limit of the range mentioned above, the composition will be at a disadvantage in failing to enhance the photo-curing properties. Conversely, the amount larger than the upper limit of the range mentioned above is not desirable because a tack-free touch of finger of a coating film will be impaired.

The photocurable and thermosetting composition of the present invention, besides the components described above, contains further a polyfunctional epoxy compound (E) having at least two epoxy groups in its molecule as a thermosetting component. As a result, this composition can be advantageously used for the formation of various resinous insulating layers, for the use as an etching resist and a marking ink, and for the formation of a solder resist on printed circuit boards, for example.

As examples of such a polyfunctional epoxy compound, epoxy resins which exhibit sparing solubility in a diluent to be used, such as bisphenol S type epoxy resins represented by EBPS-200 produced by Nippon Kayaku Co., Ltd., EPX-30 produced by Asahi Denka Kogyo K.K., and EPICLON EXA-1514 (EPICLON is a registered trademark) produced by Dainippon Ink and Chemicals Inc.; diglycidyl phthalate resin represented by BLEMMER-DGT (BLEMMER is a registered trademark) produced by Nippon Oil and Fats Co., Ltd.; heterocyclic epoxy resins represented by TEPIC (registered trademark) produced by Nissan Chemical Industries Ltd. and ARALDITE PT810 (ARALDITE is a registered trademark) produced by Ciba Specialty Chemicals Inc.; bixylenol type epoxy resins represented by YX-4000 produced by Yuka-Shell Epoxy K.K.; biphenol type epoxy resins represented by YL-6056 produced by Yuka-Shell Epoxy K.K.; and tetraglycidyl xylenoyl ethane resins represented by ZX-1063 produced by Tohto Kasei Co., Ltd.; and epoxy resins which exhibit solubility in a diluent to be used, such as bisphenol A type epoxy resins represented by EPIKOTE-1009 and -1031 (EPIKOTE is a registered trademark) produced by Yuka-Shell Epoxy K.K., EPICLON N-3050, N-7050, and N-9050 produced by Dainippon Ink and Chemicals Inc., AER-664, AER-667, and AER-669 produced by Asahi Chemical Industry Co., Ltd., YD-012, YD-014, YD-017, YD-020, and YD-002 produced by Tohto Kasei Co., Ltd., XAC-5005, GT-7004, -6484T, and -6099 produced by Ciba Specialty Chemicals Inc., DER-642U and DER-673MF produced by The Dow Chemical Company, and EP-5400 and EP-5900 produced by Asahi Denka Kogyo Co., Ltd.; hydrogenated bisphenol A type epoxy resins represented by ST-2004 and ST-2007 produced by Tohto Kasei Co., Ltd.; bisphenol F type epoxy resins represented by YDF-2004 and YDF-2007 produced by Tohto Kasei Co., Ltd. and GK-5079L produced by Shinnittetsu Kagaku Co., Ltd; brominated bisphenol A type epoxy resins represented by SR-BBS and SR-TBA-400 produced by Sakamoto Yakuhin Kogyo Co., Ltd., EP-62 and EP-66 produced by Asahi Denka Kogyo Co., Ltd., AER-755 and AER-765 produced by Asahi Chemical Industry Co., Ltd., and YDB-600 and YDB-715 produced by Tohto Kasei Co., Ltd.; novolak type epoxy resins represented by EPPN-201, EOCN-103, EOCN-1020, EOCN-1025, and BREN produced by Nippon Kayaku Co., Ltd., ECN-278, ECN-292, and ECN-299 produced by Asahi Chemical Industry Co., Ltd., ECN-1273 and ECN-1299 produced by Ciba Specialty Chemicals Inc., YDCN-220L, YDCN-220HH, YDCN-702, YDCN-704, YDPN-601, and YDPN-602 produced by Tohto Kasei Co., Ltd., and EPICLON N-673, N-680, N-695, N-770, and N-775 produced by Dainippon Ink and Chemicals Inc.; novolak type epoxy resins of bisphenol A represented by EPX-8001, EPX-8002, EPPX-8060, and EPPX-8061 produced by Asahi Denka Kogyo Co., Ltd. and EPICLON N-880 produced by Dainippon Ink and Chemicals Inc.; chelate type epoxy resins represented by EPX-49-60 and EPX-49-30 produced by Asahi Denka Kogyo Co., Ltd.; glyoxal type epoxy resins represented by YDG-414 produced by Tohto Kasei Co., Ltd.; amino group-containing epoxy resins represented by YH-1402 and ST-110 produced by Tohto Kasei Co., Ltd. and YL-931 and YL-933 produced by Yuka-Shell Epoxy K.K.; rubber-modified epoxy resins represented by TSR-601 produced by Dainippon Ink and Chemicals Inc. and EPX-84-2 and EPX-4061 produced by Asahi Denka Kogyo Co., Ltd.; dicyclopentadiene phenolic type epoxy resins represented by DCE-400 produced by Sanyo-Kokusaku Pulp Co., Ltd.; silicone-modified epoxy resins represented by X-1359 produced by Asahi Denka Kogyo Co., Ltd.; and ε-caprolactone-modified epoxy resins represented by Placcel G-402 and G-710 produced by Daicel Chemical Industries, Ltd. may be cited. These epoxy resins may be used either singly or in the form of a combination of two or more members. Among other epoxy resins cited above, the finely pulverized epoxy resins which exhibit sparing solubility in a diluent to be used or a combination of the sparingly soluble epoxy resin and the soluble epoxy resin prove to be particularly desirable.

The amount of the aforementioned polyfunctional epoxy compound (E) to be incorporated in the composition as a thermosetting component is desired to be in the range of about 5 to 100 parts by weight, preferably about 15 to 60 parts by weight, based on 100 parts by weight of the total amount of the photosensitive prepolymer (A) and the carboxyl group-containing copolymer resin (B) mentioned above.

In the second embodiment of the photocurable and thermosetting composition of the present invention, as mentioned hereinbefore, an inorganic filler (F) is added thereto for the purpose of forming microfine rises and falls in the film surface to further lower the gloss value and also for the purpose of enhancing the properties thereof such as adhesiveness and hardness.

As concrete examples of the inorganic filler (F), barium sulfate, barium titanate, power of silicon oxide such as crystalline silica, amorphous silica, talc, magnesium carbonate, calcium carbonate, aluminum oxide, aluminum hydroxide, glass fiber, carbon fiber, and mica may be cited.

It is desirable that the inorganic filler to be used should possess a particle diameter in the range of about 0.05 to 10 $\mu$m, preferably in the range of about 0.1 to 5 $\mu$m. When the inorganic filler exhibiting high oil absorption is used, a matte film with the more lowered degree of gloss is obtained. In view of this point, it is desirable that the inorganic filler should have an oil absorption of about 15 ml/100 g or more, preferably about 30 to 200 ml/100 g. The term "oil absorption" as used herein means "ml" of oil which is determined by gradually adding linseed oil to 100 g of an inorganic filler powder, observing the state of an inorganic filler while kneading them, and finding the point at which an agglomerate is formed from inorganic particles in the scattering dispersed state, i.e. ml of oil at this point.

The amount of the inorganic filler (F) to be incorporated is desired to be not more than about 250 parts by weight, preferably about 50 to 100 parts by weight, based on 100 parts by weight of the total amount of the photosensitive prepolymer (A) and the carboxyl group-containing copolymer resin (B) mentioned above.

The photocurable and thermosetting composition obtained as described above functions fully satisfactorily as a solder resist without requiring additional use of an epoxy resin curing agent because the aforementioned photosensitive prepolymer (A) and the carboxyl group-containing copolymer resin (B) contain hydroxyl groups and/or carboxyl groups and these hydroxyl groups and/or carboxyl groups function as a curing agent for the polyfunctional epoxy compound (E). When the photopolymerization initiator (C) mentioned above includes an amino group-containing photopolymerization initiator or photosensitizer intended for enhancement of photosensitivity, the curing of the polyfunctional epoxy compound (E) mentioned above is further promoted by the effects of amino groups of the photopolymerization initiator and the photosensitizer. For the purpose of further enhancing such characteristic properties as adhesiveness, resistance to chemicals, and heat resistance, however, it is desirable to use the composition as mixed with an extra curing agent for epoxy resin (G).

As the epoxy resin curing agent or curing catalyst (G) mentioned above, for example, imidazole and imidazole derivatives such as 2-methylimidazole, 2-ethyl-imidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole; guanamines such as guanamine, acetoguanamine, and benzoguanamine; and amine compounds such as dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine, and melamine. These compounds may be used either singly or in the form of a combination of two or more members. The curing agents which are commercially available include 2MZ-A, 2MZ-OK, 2PHZ, 2P4BHZ, and 2P4MHZ (invariably product names of imidazole type compounds) produced by Shikoku Chemicals Co., Ltd. and U-CAT 3503X, U-CAT 3502X (invariably product names of isocyanate compounds blocked with dimethyl amine) produced by Sun-Apro Ltd., for example. It is desired to lower the reaction starting temperature of the curing reaction by having the aforementioned epoxy resin curing agent incorporated in the composition.

The amount of the epoxy resin curing agent to be incorporated in the composition may be in the conventionally used range, for instance in the range of about 0.01 to 10 parts by weight, preferably in the range of about 0.1 to 2.0 parts by weight, based on 100 parts by weight of the total amount of the photosensitive prepolymer (A) and the carboxyl group-containing copolymer resin (B) mentioned above.

The thermosetting component (the polyfunctional epoxy compound (E) and the epoxy resin curing agent (G)) mentioned above may be mixed in advance with the aforementioned photocurable liquid resist composition. Since the composition is liable to gain in viscosity prior to being applied to a blank circuit board, however, it is proper to have them mixed immediately prior to use. To be specific, it is appropriate to prepare two separate solutions, i.e. a hardener solution comprising the aforementioned epoxy compound (E) as a main component and a main agent solution comprising the aforementioned photosensitive prepolymer (A) and the carboxyl group-containing copolymer resin (B) as main components and an epoxy resin curing agent (G) added thereto, and mix these solutions prior to use. The aforementioned photopolymerizable monomers, coloring pigments, etc. may be mixed into an organic solvent solution of the aforementioned polyfunctional epoxy compound (E) as the thermosetting component.

Although the photocurable and thermosetting composition of the present invention allows formation of a matte film without using a matting agent and a filler precipitation preventing agent possessed of a thixotropy adjustment effect, it may contain the matting agent and the filler precipitation preventing agent to such an extent that the properties of the film will not be adversely affected.

As the matting agent and the filler precipitation preventing agent, those described in Japanese Patent Application, KOKAI No. 9-157574 and corresponding U.S. Pat. No. 5,753,722 may be advantageously used, the teachings of which are hereby incorporated by reference.

A suitable amount of the matting agent to be used is not more than about 100 parts by weight, preferably not more than about 50 parts by weight, based on 100 parts by weight of the total amount of the photosensitive prepolymer (A) and the carboxyl group-containing copolymer resin (B) mentioned above. On the other hand, a suitable amount of the filler precipitation preventing agent to be used is not more than about 10 parts by weight, preferably not more than about 5 parts by weight, based on 100 parts by weight of the total amount of the photosensitive prepolymer (A) and the carboxyl group-containing copolymer resin (B) mentioned above. If the amounts of the matting agent and the filler precipitation preventing agent to be used are unduly large, the characteristics of the resist film such as the hardness, resistance to chemicals, and insulating properties will be adversely affected.

Further, the composition of the present invention may incorporate therein, as desired, a well known and widely used additive such as a coloring pigment represented by phthalocyanine blue, phthalocyanine green, Iodine Green, disazo yellow, crystal violet, titanium oxide, carbon black, and naphthalene black; a well known and widely used thermal polymerization inhibitor represented by hydroquinone, hydroquinone monomethyl ether, t-butyl catechol, pyrogallol, and phenothiazine; a well known and widely used thickening agent represented by asbestos and finely powdered silica; an anti-foaming agent and/or leveling agent represented by silicone type, fluorine type, or macromolecular type; and an adhesiveness-imparting agent represented by imidazole type, thiazole type, triazole type, and silane coupling agent.

The photocurable and thermosetting composition of the present invention is adjusted, when necessary, to a level of viscosity suitable for the coating method, applied by the technique of screen printing, curtain coating, spray coating, roll coating, or the like to a printed circuit board having a circuit already formed thereon, for example, and then dried at a temperature in the range of about 60 to 100° C., for example, thereby to evaporate the organic solvent from the coated composition and give rise to a tack-free coating film. Thereafter, the coating film is selectively exposed to an actinic radiation through a photomask having a prescribed pattern by the contact exposure or non-contact exposure method and the unexposed areas of the coating film are developed with a dilute aqueous alkaline solution (for example, an aqueous solution of about 0.5 to 5% sodium carbonate) to form a resist pattern. Then, the photocured coating film is further thermally cured by subjecting to the heat treatment at a temperature in the range of about 140 to 180° C., for example. By this thermal treatment, in addition to the curing reaction of the aforementioned thermosetting components, the polymerization of the photocurable resin components is promoted and the copolymerization of these components with the thermosetting component are also facilitated so that the consequently produced resist film acquires improvements in various properties such as resistance to heat, resistance to adhesion of solder, resistance to solvents, resistance to acids, adhesiveness, resistance to electroless gold plating, electrical properties, and hardness. The composition proves particularly useful for the formation of a solder resist.

As an aqueous alkaline solution to be used in the process of development mentioned above, aqueous alkaline solutions of potassium hydroxide, sodium hydroxide, sodium carbonate, potassium carbonate, sodium phosphate, sodium silicate, ammonia, amines, etc. can be used.

The suitable light sources which are used for the purpose of photo-curing the coating film include a low-pressure mercury lamp, a medium-pressure mercury lamp, a high-pressure mercury lamp, an ultra-high-pressure mercury lamp, a xenon lamp, and a metal halide lamp, for example. Besides, the laser beam or the like can be utilized as the actinic radiation for exposure of the film.

Now, the present invention will be described specifically below with reference to working examples and comparative examples. It should be noted, however, that the following Examples are intended to be merely illustrative of and in any sense restrictive of the present invention. Wherever the term "parts" is used hereinbelow, it shall refer to "parts by weight" unless otherwise specified.

SYNTHESIS EXAMPLE 1

Into a four-necked flask equipped with a stirrer and a reflux condenser, 220 parts of cresol novolak type epoxy resin (manufactured by Dainippon Ink and Chemicals Inc., registered trademark "EPICLON" N-695, epoxy equivalent: 220) was charged and then 214 parts of carbitol acetate was added thereto and they were molten by heating. Then, 0.1 part of hydroquinone as a polymerization inhibitor and 2.0 parts of dimethylbenzylamine as a reaction catalyst were added thereto. The resultant mixture was heated to 95–105° C., 72 parts of acrylic acid was gradually added dropwise thereto, and they were left reacting for 16 hours. The resultant reaction product was cooled to 80–90° C., 106 parts of tetrahydrophthalic anhydride was added thereto, and the mixture was left reacting for 8 hours and cooled, and then the reaction product was extracted therefrom.

The photosensitive resin having ethylenically unsaturated bonds together with carboxyl groups obtained as described above had a nonvolatile content of 65%, an acid value of a solid content of 100 mg KOH/g, and a weight-average molecular weight, Mw, of about 3,500. Hereinafter, this resin solution will be referred to as varnish "a".

Incidentally, the weight-average molecular weight of the obtained resin was determined by high-speed liquid chromatography connected to pumps manufactured by Shimadzu Seisakusho Ltd., LC-804, KF-803, and KF-802.

SYNTHESIS EXAMPLE 2

Into a 2-liter separable flask, 450 parts of dipropylene glycol monomethyl ether as a solvent and 2 parts of azobisisobutyronitrile (hereinafter referred to briefly as "AIBN") as a catalyst were added and a three-necked separable flask cover equipped with a stirring rod made of Teflon (registered trademark), a cooling tube, and a dropping funnel was fitted, and they were immersed in an oil bath and heated to 110° C. while stirring them so as to keep a uniform temperature. The components of a polymer (120 parts of methyl methacrylate, 233 parts of isobornyl methacrylate, 99.5 parts of 2-hydroxyethyl methacrylate, and 46.4 parts of methacrylic acid) were mixed with 0.9 part of AIBN uniformly in the dropping funnel and added dropwise to the separable flask mentioned above while adjusting the dropping amount so as to finish the dropping of the total amount thereof after one hour. After completion of the dropping of the total amount, 50 parts of the solvent mentioned above was added to the dropping funnel and completely dropped while washing away the components adhered to the dropping funnel. After this dropping, they were heated for one hour to obtain a viscous resin solution having a solid content of 50%. This resin solution will be hereinafter referred to as varnish "b-1".

SYNTHESIS EXAMPLE 3

Into a flask equipped with a thermometer, a stirrer, a dropping funnel, and a reflux condenser, methyl methacrylate, ethyl methacrylate, and methacrylic acid were charged in a molar ratio of 1:1:2 and dipropylene glycol monomethyl ether as a solvent and AIBN as a catalyst were added thereto and they were together stirred under an atmosphere of nitrogen gas at 80° C. for 4 hours to obtain a resin solution.

The resultant resin solution was cooled and, in the presence of methyl hydroquinone used as a polymerization inhibitor and tetrabutyl phosphonium bromide used as a catalyst, subjected to addition reaction of glycidyl methacrylate at a ratio of 20 mol % of the carboxyl groups of the resin mentioned above under the conditions of 95–105° C. and 16 hours. The reaction product was cooled and then extracted therefrom.

The photosensitive resin having ethylenically unsaturated bonds together with carboxyl groups obtained as described above had a nonvolatile content of 65%, an acid value of a solid content of 120 mg KOH/g, and a weight-average molecular weight, Mw, of about 20,000. Hereinafter, this resin solution will be referred to as varnish "b-2".

SYNTHESIS EXAMPLE 4

Into a flask equipped with a thermometer, a stirrer, a dropping funnel, and a reflux condenser, methyl methacrylate and glycidyl methacrylate were charged in a molar ratio of 4:6 and carbitol acetate as a solvent and AIBN as a catalyst were added thereto and they were together stirred under an atmosphere of nitrogen gas at 80° C. for 4 hours to obtain a resin solution. The resultant resin solution was cooled and, in the presence of methyl hydroquinone used as a polymerization inhibitor and tetrabutyl phosphonium bromide used as a catalyst, subjected to addition reaction of acrylic acid at a ratio of 100% of the epoxy groups of the resin mentioned above under the conditions of 95–105° C. and 16 hours. The reaction product was cooled to 80–90° C., subjected to the reaction with tetrahydrophthalic anhydride for 8 hours, cooled, and then extracted therefrom.

The photosensitive resin having ethylenically unsaturated bonds together with carboxyl groups obtained as described above had a nonvolatile content of 65%, an acid value of a solid content of 100 mg KOH/g, and a weight-average molecular weight, Mw, of about 15,000. Hereinafter, this resin solution will be referred to as varnish "b-3".

The raw materials used in the following working examples and comparative examples are shown in Table 1.

TABLE 1

| | Components | Chemical name or product name |
|---|---|---|
| Main agent | Photosensitive prepolymer | Varnish "a" obtained in Synthesis Example 1 |
| | Carboxyl group-containing copolymer resin | Varnish "b-1" obtained in Synthesis Example 2 |
| | | Varnish "b-2" obtained in Synthesis Example 3 |
| | | Varnish "b-3" obtained in Synthesis Example 4 |
| | Filler     A | Crystalline silica (average particle diameter: 1.5 μm, oil absorption: 35–40 ml/100 g) |
| | B | Talc (average particle diameter: 1.5–1.8 μm, oil absorption: 45–50 ml/100 g) |
| | C | Precipitated barium sulfate (average particle diameter: 0.5–0.6 μm, oil absorption: 15–20 ml/100 g) |
| | Photopolymerization initiator | 2-Methyl-1-[4-(methylthio)phenyl]-2-morphorino-propan-1-one |
| | Coloring pigment | Phthalocyanine green |
| | Epoxy resin curing catalyst | Dicyandiamide |
| | Diluent | Dipropylene glycol monomethyl ether |
| | Anti-foaming agent | Silicone-based anti-foaming agent (KS-66, manufactured by Shinetsu Chemical Industries Co., Ltd.) |
| | Additive | BYK-110 (manufactured by BYK Chemie Japan K.K.) |
| Hardener | Photopolymerizable monomer | Dipentaerythritol hexaacrylate |
| | Epoxy resin | TEPIC (manufactured by Nissan Chemical Industries Ltd.) |
| | Diluent | Dipropylene glycol monomethyl ether |

EXAMPLES 1–12

A main agent was prepared by compounding relevant components at proportions shown in Table 2 and kneading them with a three-roll mill. A hardener was prepared similarly by compounding relevant components at proportions shown in Table 2 and kneading them with a three-roll mill. A liquid resist composition of two-part liquid system thus obtained was prepared for use by mixing the main agent and the hardener.

TABLE 2

| | | Example No. | | | | | | | | | | | |
|---|---|---|---|---|---|---|---|---|---|---|---|---|---|
| Components and amount (parts) | | 1 | 2 | 3 | 4 | 5 | 6 | 7 | 8 | 9 | 10 | 11 | 12 |
| Main agent | | | | | | | | | | | | | |
| Varnish | a | 60 | 60 | 60 | 60 | 90 | 75 | 50 | 30 | 60 | 60 | 60 | 60 |
| (solid content) | b-1 | — | 40 | — | — | — | — | — | — | — | — | — | — |
| | b-2 | 40 | — | 40 | — | 10 | 25 | 50 | 70 | 40 | 40 | 40 | 40 |
| | b-3 | — | — | — | 40 | — | — | — | — | — | — | — | — |
| Filler | A | — | 100 | 100 | 100 | 100 | 100 | 100 | 100 | 50 | 200 | — | — |
| | B | — | — | — | — | — | — | — | — | — | — | 100 | — |
| | C | — | — | — | — | — | — | — | — | — | — | — | 100 |
| Photopolymerization initiator | | 15 | 15 | 15 | 15 | 15 | 15 | 15 | 15 | 15 | 15 | 15 | 15 |
| Coloring pigment | | 1 | 1 | 1 | 1 | 1 | 1 | 1 | 1 | 1 | 1 | 1 | 1 |
| Epoxy resin curing catalyst | | 0.5 | 0.5 | 0.5 | 0.5 | 0.5 | 0.5 | 0.5 | 0.5 | 0.5 | 0.5 | 0.5 | 0.5 |
| Diluent | | 10 | 20 | 20 | 20 | 20 | 20 | 20 | 20 | 20 | 30 | 20 | 20 |
| Anti-foaming agent | | 1 | 1 | 1 | 1 | 1 | 1 | 1 | 1 | 1 | 1 | 1 | 1 |
| Additive | | 0.5 | 0.5 | 0.5 | 0.5 | 0.5 | 0.5 | 0.5 | 0.5 | 0.5 | 0.5 | 0.5 | 0.5 |

TABLE 2-continued

| Components and amount (parts) | Example No. | | | | | | | | | | | |
|---|---|---|---|---|---|---|---|---|---|---|---|---|
| | 1 | 2 | 3 | 4 | 5 | 6 | 7 | 8 | 9 | 10 | 11 | 12 |
| Hardener | | | | | | | | | | | | |
| Photopolymerizable monomer | 20 | 20 | 20 | 20 | 20 | 20 | 20 | 20 | 20 | 20 | 20 | 20 |
| Epoxy resin | 30 | 30 | 30 | 30 | 30 | 30 | 30 | 30 | 30 | 30 | 30 | 30 |
| Diluent | 10 | 10 | 10 | 10 | 10 | 10 | 10 | 10 | 10 | 10 | 10 | 10 |

COMPARATIVE EXAMPLES 1 TO 3

A main agent was prepared by compounding relevant components at proportions shown in Table 3 and kneading them with a three-roll mill. A hardener was prepared similarly by compounding relevant components at proportions shown in Table 3 and kneading them with a three-roll mill. A liquid resist composition of two-part liquid system thus obtained was prepared for use by mixing the main agent and the hardener.

TABLE 3

| Components and amount (parts) | | Comparative Example No. | | |
|---|---|---|---|---|
| | | 1 | 2 | 3 |
| Main agent | | | | |
| Varnish | a | 100 | 100 | — |
| (solid content) | b-1 | — | — | — |
| | b-2 | — | — | 100 |
| | b-3 | — | — | — |
| Filler | A | — | 100 | 100 |
| | B | — | — | — |
| | C | — | — | — |
| Photopolymerization initiator | | 15 | 15 | 15 |
| Coloring pigment | | 1 | 1 | 1 |
| Epoxy resin curing catalyst | | 0.5 | 0.5 | 0.5 |
| Diluent | | 10 | 20 | 20 |
| Anti-foaming agent | | 1 | 1 | 1 |
| Additive | | 0.5 | 0.5 | 0.5 |
| Hardener | | | | |
| Photopolymerizable monomer | | 20 | 20 | 20 |
| Epoxy resin | | 30 | 30 | 30 |
| Diluent | | 10 | 10 | 10 |

TEST EXAMPLES

Each of the liquid resist compositions obtained in Examples 1 to 12 and Comparative Examples 1 to 3 as described above was tested for the following items and the results were rated.

(1) Printability:

Each of the liquid resist compositions was printed on a substrate, B package of the IPC standard, with a PET screen of 100 meshes by the use of a printing machine (manufactured by Seria K.K.). The intervals between circuits on the resultant cured film were observed through an optical microscope (30 magnifications) to determine and rate the occurrence of bubbles and print skips based on the following criteria.

Bubbles:

○: Good film with no discernible bubble

Δ: Presence of slightly discernible bubbles

X: Presence of conspicuously discernible bubbles

Skips:

○: Good film with no discernible skip

Δ: Presence of slightly discernible skips

X: Presence of conspicuously discernible skips (2) Glossiness:

Each of the liquid resist compositions was applied on a copper foil-laminated substrate throughout the entire surface thereof by screen printing and the applied layer was dried at 80° C. for 30 minutes to form a tack-free coating film. The substrate was exposed to light according to a prescribed pattern through a negative film superposed thereon and then developed with an aqueous 1 wt % $Na_2CO_3$ solution under a spray pressure of 1.5 kg/cm$^2$ to form a pattern. This substrate was subjected to thermal curing at 150° C. for 60 minutes to produce a test substrate.

The surface of each test substrate was measured for 60° glossiness (gloss value) with Microtrigloss (manufactured by BYC Chemie Japan K.K.). The 60° glossiness was expressed with an integer which was obtained by half-adjusting the first digit after the decimal point of the average found by the measurement.

(3) Wettability Test

A test substrate prepared in accordance with item (2) mentioned above was measured for the wetting index (mN/m) under the conditions of 23° C. and 50% R.H. in accordance with the testing method specified in JIS (Japanese Industrial Standard) K-6768.

(4) Resistance to Adhesion of Solder:

A test substrate was prepared in the same manner as the method for preparation of a test substrate in item (2) mentioned above.

By the use of a flow soldering device (manufactured by Tokyo Seisan Giken K.K.), the test substrate produced as described above as provided with a resist film, 20 μm in thickness, was subjected in the open air, without being coated with flux, to soldering. The soldering was carried out by the wave soldering process under the conditions of a solder temperature of 260° C., double wave, and a conveyor speed of 1.4 m/minute. Then the surface of the resist film was visually examined to determine the condition of adhesion of solder thereto and the degree of adhesiveness was rated based on the following criterion.

○: Good surface with no discernible adhesion of solder

X: Discernible adhesion of solder in the form of thorns and a cobweb (5) Resistance to Electroless Gold Plating:

Preparation of a test substrate:

A test substrate was prepared in the same manner as the method for preparation of a test substrate in item (2) mentioned above.

Method for electroless gold plating:

The test substrate prepared as described above was degreased by dipping in an acidic degreasing solution (an aqueous 20 vol. % solution of Metex L-5B manufactured by Japan MacDermid Co., Ltd.) at 30° C. for 3 minutes and then washed with water by dipping in running water for 3 minutes. Next, the test substrate was subjected to soft etching by dipping in an aqueous 14.3 wt. % ammonium persulfate solution at room temperature for 3 minutes and then washed with water by dipping in running water for 3 minutes. After dipping in an aqueous 10 vol. % sulfuric acid solution for one minute at room temperature, the test substrate was washed with water by dipping in running water for 30 seconds to one minute. Then the test substrate was dipped in a catalyst solution (an aqueous 10 vol. % solution of Metal Plate Activator 350 manufactured by Meltex Inc.) at 30° C. for 7 minutes to thereby add the catalyst thereto and then washed with water by dipping in running water for 3 minutes. This test substrate having the catalyst added thereto was subjected to electroless nickel plating by dipping in a nickel plating solution (an aqueous 20 vol. % solution of Melplate Ni-865M, manufactured by Meltex Inc., pH 4.6) at 85° C. for 20 minutes. After dipping in an aqueous 10 vol. % sulfuric acid solution at room temperature for one minute, the test substrate was washed with water by dipping in running water for 30 seconds to one minute. Next, the test substrate was subjected to electroless gold plating by dipping in a gold plating solution (an aqueous solution of 15 vol. %. of Aurolectroless UP manufactured by Meltex Inc. and 3 vol. % of gold potassium cyanide, pH 6) at 85° C. for 10 minutes. Then it was washed with water by dipping in running water for 3 minutes and with hot water by dipping in hot water at 60° C. for 3 minutes. After sufficient washing with water, thorough draining, and drying, an electroless gold plated test substrate was obtained.

Resistance to electroless gold plating:

After the test substrate was plated with gold as described above, a cellophane adhesive tape was applied to the plated test substrate and was then peeled therefrom. Then the test substrate was examined to determine the presence or absence of peeling of the resist layer and the presence or absence of infiltration of the plating liquid into the interface between the substrate and the resist layer based on the following criterion.

○: Total absence of discernible change

Δ: Slight peeling of resist layer and discernible sign of infiltration observed

X: Clear peeling of resist layer observed (6) Adhesiveness:

A test substrate was prepared in the same manner as the method for preparation of a test substrate in item (2) mentioned above. The test substrate was incised like crosscut in the shape of squares in a go board and then subjected to a peel test with a cellophane adhesive tape in accordance with the method specified in JIS D-0202 to determine the degree of separation of the resist layer based on the following criterion.

○: Absolutely no peeling of the resist layer observed

Δ: only slight peeling of the resist layer observed

X: Peeling of the resist layer observed (7) Resistance to Electrolytic Corrosion:

A test substrate was prepared in the same manner as the method for preparation of a test substrate in item (2) mentioned above, except that a comb electrode B coupon of IPC B-25 in the place of the copper foil-laminated substrate. The test substrate was kept standing in a pressure cooker for 48 hours under the conditions of 121° C. and 98% R.H. (2 atm), with a bias voltage of DC 100V applied to the comb electrode, and examined to determine whether or not it suffered occurrence of migration based on the following criterion.

○: Absolutely no change observed

Δ: Only slight change observed

X: Occurrence of migration observed

The results of the tests described above are collectively shown in Table 4.

TABLE 4

| Properties | | Example No. | | | | | | | | | | | | Comp. Exam. No. | | |
|---|---|---|---|---|---|---|---|---|---|---|---|---|---|---|---|---|
| | | 1 | 2 | 3 | 4 | 5 | 6 | 7 | 8 | 9 | 10 | 11 | 12 | 1 | 2 | 3 |
| Printability | Bubbles | — | ○ | ○ | ○ | ○ | ○ | ○ | ○ | ○ | ○ | Δ | ○ | — | ○ | ○ |
| | Skips | — | ○ | ○ | ○ | ○ | ○ | ○ | ○ | ○ | ○ | X | ○ | — | ○ | ○ |
| Glossiness | | 37 | 5 | 3 | 34 | 18 | 4 | 7 | 30 | 38 | 3 | 4 | 40 | 94 | 71 | 58 |
| Wetting index (mN/m) | | — | 54 | 54 | 45 | 50 | 54 | 53 | 47 | 44 | 54 | 53 | 43 | — | 31 | 37 |
| Resistance to adhesion of solder | | — | ○ | ○ | ○ | ○ | ○ | ○ | ○ | ○ | ○ | ○ | ○ | — | x | x |
| Resistance to electroless gold plating | | — | ○ | ○ | ○ | ○ | ○ | ○ | ○ | ○ | ○ | ○ | ○ | — | ○ | x |
| Adhesiveness | | — | ○ | ○ | ○ | ○ | ○ | ○ | ○ | ○ | ○ | ○ | ○ | — | ○ | ○ |
| Resistance to electrolytic corrosion | | — | ○ | ○ | ○ | ○ | ○ | ○ | ○ | ○ | ○ | Δ | ○ | — | ○ | Δ |

It is clearly noted from the results shown in Table 4 that the liquid resist compositions of Examples 1 to 12 according to the present invention excelled in printability and ability to form fine patterns and that the resist films made thereof were matte films of low gloss excelling in resistance to adhesion of solder, resistance to electroless gold plating, and adhesiveness. Further, as being clear from the comparison of Examples 3 and 11 with Example 12, the matte film obtained from the resist composition using the filler A or B possessed of a large oil absorption (Examples 3 and 11) exhibited more lower gloss and enhanced wettability as compared with that obtained from the resist composition using the filler C possessed of a small oil absorption (Example 12).

On the other hand, in the resist compositions using either one of the photosensitive prepolymer (A) and the carboxyl group-containing copolymer resin (B) (Comparative Examples 1 to 3), it was hardly possible to obtain a matte film from the composition of Comparative Example 1 containing no filler, or a resist film having high glossiness was obtained from the compositions of Comparative Examples 2 and 3 even when containing fillers, and the resist films produced with these compositions were deficient not only in the wetting index but also in such properties as resistance to adhesion of solder and resistance to electroless gold plating.

As described above, since the photocurable and thermosetting composition of the present invention is capable of forming a matte film which exhibits low gloss and excels in such film properties as resistance to adhesion of solder during the course of wave soldering, resistance to chemicals, resistance to electroless gold plating, electrical insulating properties, resistance to heat, and hardness and is possessed of excellent fastness of adhesion to a copper foil and to various deposited layers by plating owing to microfine rises and falls in the film surface, it is particularly useful in forming a matte solder resist in a printed circuit board. Besides, the composition can be used for the formation of various resin insulating layers such as interlaminar insulating layers in printed circuit boards and for the use as an etching resist, a marking ink, and the like.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A photocurable and thermosetting composition for forming a matte film, comprising (A) a photosensitive prepolymer obtained by causing a saturated or unsaturated polybasic acid anhydride to react with a hydroxyl group of an esterification product of a novolak type epoxy compound and an unsaturated monocarboxylic acid, (B) a carboxyl group-containing copolymer resin, (C) a photopolymerization initiator, (D) a diluent, and (E) a polyfunctional epoxy compound having at least two epoxy groups in its molecule, wherein the ratio of said photosensitive prepolymer (A) to said carboxyl group-containing copolymer resin (B) to be incorporated is (A):(B)=100:5–<100 in weight ratio.

2. The composition according to claim 1, which further comprises (G) a curing agent for epoxy resin.

3. The composition according to claim 1, wherein said carboxyl group-containing copolymer resin (B) is at least one resin selected from the group consisting of (b-1) a copolymer of an unsaturated carboxylic acid with another compound having an unsaturated double bond, (b-2) a prepolymer obtained by causing an epoxy group-containing unsaturated compound to partially react with a carboxyl group of a copolymer of an unsaturated carboxylic acid and another compound having an unsaturated double bond, and (b-3) a prepolymer obtained by causing addition reaction of a carboxyl group-containing compound to an epoxy group of an epoxy group-containing copolymer and then causing a saturated or unsaturated polybasic acid anhydride to react with a hydroxyl group caused by the above reaction.

4. The composition according to claim 1, wherein said photopolymerization initiator (C) is at least one compound selected from the group consisting of acetophenones, benzophenones, benzoin and alkyl ethers thereof, ketals, thioxanthones, anthraquinones, organic peroxides, thiol compounds, and organic halogen compounds and the content thereof is in the range of 0.2 to 30 parts by weight, based on 100 parts by weight of said photosensitive prepolymer (A).

5. The composition according to claim 1, wherein said diluent (D) is an organic solvent and the content thereof is in the range of 30 to 300 parts by weight, based on 100 parts by weight of the total amount of said photosensitive prepolymer (A) and said carboxyl group-containing copolymer resin (B).

6. The composition according to claim 1, wherein said diluent (D) is a photopolymerizable monomer and the content thereof is in the range of 3 to 50 parts by weight, based on 100 parts by weight of the total amount of said photosensitive prepolymer (A) and said carboxyl group-containing copolymer resin (B).

7. The composition according to claim 1, wherein said polyfunctional epoxy compound (E) is an epoxy resin which exhibits sparing solubility in the diluent (D) to be used or a mixture of said epoxy resin with an epoxy resin which is soluble in the diluent (D) to be used.

8. The composition according to claim 1, wherein the content of said polyfunctional epoxy compound (E) is in the range of 5 to 100 parts by weight, based on 100 parts by weight of the total amount of said photosensitive prepolymer (A) and said carboxyl group-containing copolymer resin (B).

9. The composition according to claim 1, which further comprises a coloring pigment.

10. The composition according to claim 1, which further comprises an anti-foaming agent or a leveling agent.

11. A printed circuit board having a resist film formed thereon from a patterned and cured resist film of said photocurable and thermosetting composition according to claim 1 and possessed of a 60° gloss value of not more than about 50 in the film surface in accordance with ASTM D 523-89.

12. A photocurable and thermosetting composition for forming a matte film, comprising (A) a photosensitive prepolymer obtained by causing a saturated or unsaturated polybasic acid anhydride to react with a hydroxyl group of an esterification product of a novolak type epoxy compound and an unsaturated monocarboxylic acid, (B) a carboxyl group-containing copolymer resin, (C) a photopolymerization initiator, (D) a diluent, (E) a polyfunctional epoxy compound having at least two epoxy groups in its molecule, and (F) an inorganic filler, wherein the ratio of said photosensitive prepolymer (A) to said carboxyl group-containing copolymer resin (B) to be incorporated is (A):(B)=100:5–<100 in weight ratio.

13. The composition according to claim 12, which further comprises (G) a curing agent for epoxy resin.

14. The composition according to claim 12, wherein said carboxyl group-containing copolymer resin (B) is at least one resin selected from the group consisting of (b-1) a copolymer of an unsaturated carboxylic acid with another compound having an unsaturated double bond, (b-2) a prepolymer obtained by causing an epoxy group-containing unsaturated compound to partially react with a carboxyl group of a copolymer of an unsaturated carboxylic acid and another compound having an unsaturated double bond, and (b-3) a prepolymer obtained by causing addition reaction of a carboxyl group-containing compound to an epoxy group of an epoxy group-containing copolymer and then causing a saturated or unsaturated polybasic acid anhydride to react with a hydroxyl group caused by the above reaction.

15. The composition according to claim 12, wherein said photopolymerization initiator (C) is at least one compound selected from the group consisting of acetophenones, benzophenones, benzoin and alkyl ethers thereof, ketals, thioxanthones, anthraquinones, organic peroxides, thiol compounds, and organic halogen compounds and the content thereof is in the range of 0.2 to 30 parts by weight, based on 100 parts by weight of said photosensitive prepolymer (A).

16. The composition according to claim 12, wherein said diluent (D) is an organic solvent and the content thereof is in the range of 30 to 300 parts by weight, based on 100 parts by weight of the total amount of said photosensitive prepolymer (A) and said carboxyl group-containing copolymer resin (B).

17. The composition according to claim 12, wherein said diluent (D) is a photopolymerizable monomer and the content thereof is in the range of 3 to 50 parts by weight, based on 100 parts by weight of the total amount of said photosensitive prepolymer (A) and said carboxyl group-containing copolymer resin (B).

18. The composition according to claim 12, wherein said polyfunctional epoxy compound (E) is an epoxy resin which exhibits sparing solubility in the diluent (D) to be used or a mixture of said epoxy resin with an epoxy resin which is soluble in the diluent (D) to be used.

19. The composition according to claim 12, wherein the content of said polyfunctional epoxy compound (E) is in the range of 5 to 100 parts by weight, based on 100 parts by weight of the total amount of said photosensitive prepolymer (A) and said carboxyl group-containing copolymer resin (B).

20. The composition according to claim 12, wherein said inorganic filler has an oil absorption of not less than 15 ml/100 g.

21. The composition according to claim 12, which further comprises a coloring pigment.

22. The composition according to claim 12, which further comprises an anti-foaming agent or a leveling agent.

23. A printed circuit board having a resist film formed thereon from a patterned and cured resist film of said photocurable and thermosetting composition according to claim 12 and possessed of a 60° gloss value of not more than about 50 in the film surface in accordance with ASTM D 523-89.

* * * * *

UNITED STATES PATENT AND TRADEMARK OFFICE
CERTIFICATE OF CORRECTION

PATENT NO. : 6,824,858 B1
DATED : November 30, 2004
INVENTOR(S) : Satoru Iwaida

It is certified that error appears in the above-identified patent and that said Letters Patent is hereby corrected as shown below:

<u>Title page,</u>
Item [75], Inventors, should read -- Ohno, Iruma-gun (JP); Masayuki --.

Signed and Sealed this

Fifth Day of July, 2005

JON W. DUDAS
*Director of the United States Patent and Trademark Office*